United States Patent [19]
Kobayashi et al.

[11] Patent Number: 5,252,140
[45] Date of Patent: Oct. 12, 1993

[54] SOLAR CELL SUBSTRATE AND PROCESS FOR ITS PRODUCTION

[76] Inventors: Shigeyoshi Kobayashi, 2-209 Kosugicho, Nakahara-ku, Kawasaki-shi, Kanagawa-Pref.; Susumu Yaba, 543, Sanmaicho, Kanagawa-ku, Yokohama-shi, Kanagawa-Pref.; Shinya Kikugawa, 3-16, Sugita Isogo-ku, Yokohama-shi, Kanagawa-Pref., all of Japan; Stephen Muhl, Paseo Del Pregonero 208-2, Colinas Del Sur, Mexico, 01430; Arun Madan, 327 Lamb La., Golden, Colo. 80401

[21] Appl. No.: 477,909

[22] Filed: Mar. 29, 1990

Related U.S. Application Data

[63] Continuation-in-part of Ser. No. 77,422, Jul. 24, 1987, abandoned.

[51] Int. Cl.$^5$ .............. H01L 31/075; H01L 31/18; C03B 27/00
[52] U.S. Cl. .............. 136/258; 136/256; 65/60.5; 65/60.51; 65/60.52; 65/60.53; 65/114; 427/126.2; 427/165; 428/432; 437/4
[58] Field of Search ........ 428/432; 136/256, 258 AM; 437/4; 65/60.5, 60.51, 60.52, 60.53, 114, 117, 118, 30.14; 427/165, 126.2

[56] References Cited

U.S. PATENT DOCUMENTS

| | | | |
|---|---|---|---|
| 4,240,816 | 12/1980 | McMaster et al. | 65/60.5 |
| 4,387,134 | 6/1983 | Kalbskopf et al. | 428/215 |
| 4,510,344 | 4/1985 | Berman | 136/256 |
| 4,571,446 | 2/1986 | Yamazaki | 136/244 |

Primary Examiner—Aaron Weisstuch
Attorney, Agent, or Firm—Brooks & Kushman

[57] ABSTRACT

A solar cell substrate comprising a glass plate, and a transparent electrically conductive layer formed thereon, wherein said glass plate is tempered.

11 Claims, 3 Drawing Sheets

SOLAR CELL SUBSTRATE AND PROCESS FOR ITS PRODUCTION

This application is a continuation-in-part of U.S. application Ser. No. 07/077,422 filed Jul. 24, 1987, now abandoned.

TECHNICAL FIELD

The present invention relates to a solar cell substrate to be used for thin film solar cells. More particularly, the present invention relates to a solar cell substrate which is tempered to avoid damage during its handling, use, transportation, or installation.

BACKGROUND ART

As shown in FIG. 1, a prior art thin film solar cell is illustrated generally as 8 and comprises a transparent insulating substrate 1, a transparent electrically conductive layer 2 formed on one surface thereof which serves as a front electrode, an amorphous silicon semiconductor layer 6 which is composed of a p-type amorphous silicon layer 3, an i-type amorphous silicon layer 4 and a n-type amorphous silicon layer 5, and an aluminum layer 7 which serves as a back electrode.

This configuration is used as a photoelectric conversion device capable of being produced at a relatively low cost. Such an amorphous silicon solar cell 8 is designed so that light 9 enters the solar cell through the transparent insulating substrate 1 and is absorbed mainly by the i-type amorphous silicon layer 4. Electricity is generated between two electrodes, the transparent electrically conductive layer 2 and the aluminum layer 7, and the electricity is led out of the solar cell by a conductor 10.

These solar cells are presently used as cells for electric calculators or as cells for watches. However, it is anticipated that such cells will soon be used for power generation after improvements in (1) the photoelectric conversion efficiency, (2) enlargement of the surface area and (3) in reductions to the cost.

If amorphous silicon solar cells are to be used for power generation, larger surface areas will be required. Accordingly, such cells will have to be installed on the rooftop or wall of a house, building, factory or other installation. However, if glass is to be used as the substrate for amorphous silicon solar cells installed in such a place, there is a possible danger that the glass plate of the solar cell will be broken, for example, when hail stones hit the solar cell. Further, there is always a possible danger that the glass plate may be broken during handling in the production of the solar cell, or during its transportation or installation. The possibility of danger particularly increases when the thickness of the glass plate is less than 3 mm, or when the surface area of the glass plate is enlarged.

SUMMARY OF INVENTION

It is an object of the present invention to provide a tempered glass plate for solar cells resistant to breakage during use of the solar cells, during handling in the production of the solar cells or during its transportation or installation. The present invention discloses a tempered solar cell substrate including a glass plate having a transparent electrically conductive layer formed thereon.

Another object of the present invention is to provide a process for the production of such a glass plate. In carrying out this object, the present invention includes a method for manufacturing a solar cell substrate by heating a glass plate, forming a transparent electrically conductive layer on at least one side of the glass plate by chemical vapor deposition, and then rapidly cooling the surfaces of the glass plate to effect tempering.

BEST MODE FOR CARRYING OUT INVENTION

Figure 1:
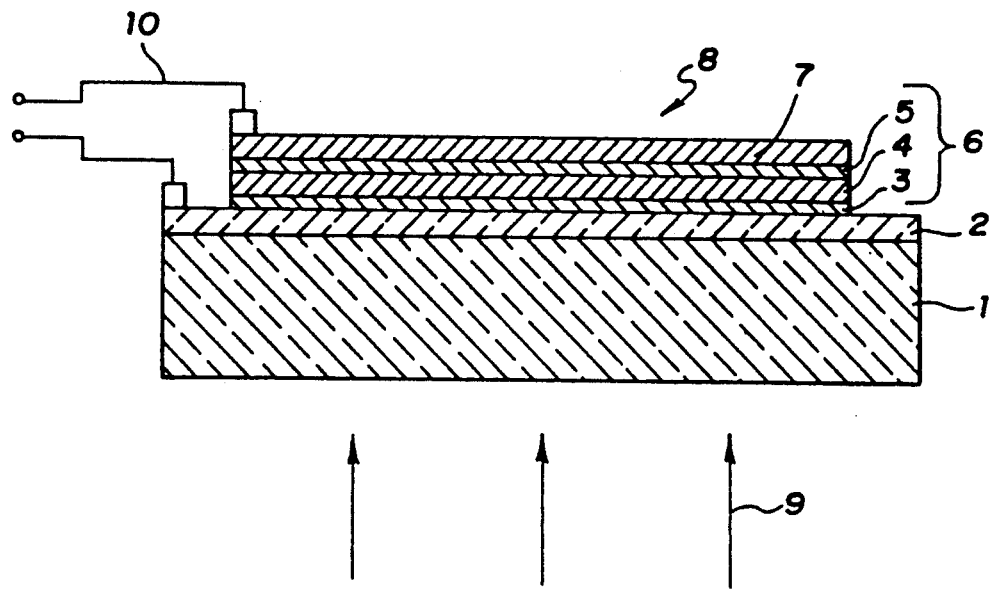
FIG. 1 is a cross-sectional view of a prior art thin film solar cell.

The glass plate to be used in the present invention is preferably a transparent glass plate having a transmittance of at least 80% in a wave length range of from 350 to 800 nm. The glass plate should also exhibit good insulating properties, high chemical and physical durabilities and excellent optical properties. For example, soda-lime silicate glass, aluminosilicate glass, borate glass, lithium aluminosilicate glass and various other glasses may be employed.

In accordance with the present invention, the tempering treatment is accomplished by distributing cooling air onto the surface of a heated glass plate. A soda-lime silicate glass plate is most suitable from the viewpoint of ease of tempering by air cooling. Low cost and availability of such glass also contribute to its attraction. In a case where the tempering treatment is applied to the glass plate by an ion exchange tempering method, it is most suitable to employ a lithium aluminosilicate glass.

There is no particular restriction as to the thickness of the glass plate. However, the thickness is preferably from 1.0 to 5 mm so that the tempering treatment is hereby facilitated. This thickness is further preferred to minimize a decrease in the transmittance of light, an undue increase of the weight, a decrease in the strength and difficulty in handling of the tempered substrate.

In the case of a glass plate made of a glass containing sodium, such as soda-lime silicate glass, or a substrate made of a low alkali-containing glass, an alkali barrier coating such as a silicon oxide layer, an aluminum oxide layer or a zirconium oxide layer may be provided on the surface of the glass plate opposite the incident surface in order to substantially prevent diffusion of ions, including sodium, from entering the transparent electrically conductive layer formed thereon.

The transparent electrically conductive material to be formed on the glass plate is preferably made of a transparent metal oxide having a good conductivity, such as tin oxide doped with from 0.1 to 5% by weight of fluorine, tin oxide doped with from 0.1 to 30% by weight of antimony, or indium oxide doped with from 0.5 to 30% by weight of tin. Of those mentioned, a transparent electrically conductive layer made of a fluorine-doped tin oxide is the most suitable as a solar cell substrate, because sheet resistances less than 30 ohms/square are easily achievable.

The transparent electrically conductive layer of the present invention may be prepared by various conventional methods such as chemical vapor deposition, pyrolytic spraying, sputtering, vacuum vapor deposition, ion plating or dipping. Of these, chemical vapor deposition and sputtering are most suitable.

In the present invention, the solar cell substrate provided with the transparent electrically conductive layer is tempered. In carrying out the tempering treatment, an air cooling tempering method may be used wherein the glass plate is heated to a temperature higher than the strain point, yet lower than the softening point, then rapidly cooling the glass plate by blowing cooling air onto its surfaces.

An alternative tempering method is liquid cooling tempering wherein the glass plate is heated in the same manner and then rapidly cooled by dipping it in a cooling liquid or by spraying it with a cooling liquid. The method also includes heating a glass plate in the same manner as described above and then rapidly cooling it by passing it through an atmosphere wherein a sublimed substance is dispersed.

Yet still another method for tempering glass is an ion exchange tempering method wherein a glass plate is brought in contact with a molten salt of an alkali metal (such as potassium nitrate) having an ionic radius larger than the alkali metal contained in the surface layer of the glass plate at a temperature not exceeding the strain point. Typically, the tempering action occurs when $Na^+$ ions in the glass plate are replaced by $K^+$ ions in the molten salt, thereby creating a compression stress in the surface layer of the glass plate due to the difference in the occupying volumes of the alkali metal ions. $K^+$ ions have a greater ionic radius due to its atomic mass than $Na^+$ ions.

In accordance with the present invention, an average surface compression stress of at least 250 $kg/cm^2$ is achieved by the tempering treatment. By imparting an average surface compression stress of at least 250 $kg/cm^2$, it is possible to substantially reduce breakage of the glass plate of solar cells by hail stones or breakage of the glass plate during handling and installation. Glass plates having a thickness of from 1 to 4 mm and a surface compression stress of 300 $kg/cm^2$ are particularly preferred.

The tempering treatment may be performed on the glass plate prior to or after the formation of the transparent electrically conductive layer. In a case where the glass plate is heated to a temperature higher than the strain point for the formation of the transparent electrically conductive layer, the tempering treatment is preferably conducted after the formation of the transparent electrically conductive layer.

If the solar cell substrate is heated after the tempering treatment to a temperature higher than the strain point for the formation of the transparent electrically conductive layer, the surface compression stress formed by the tempering treatment tends to be released, and the tempering is somewhat reversed.

Particular attention must be paid to the heating temperature when the glass plate is heated for tempering after the formation of the transparent electrically conductive layer. There is a possible danger that the transparent electrically conductive layer may be degraded.

It has been possible to minimize degradation of the transparent electrically conductive layer by refraining from heating the glass plate to a temperature no higher than 650° C. for less than two minutes.

Figure 2:
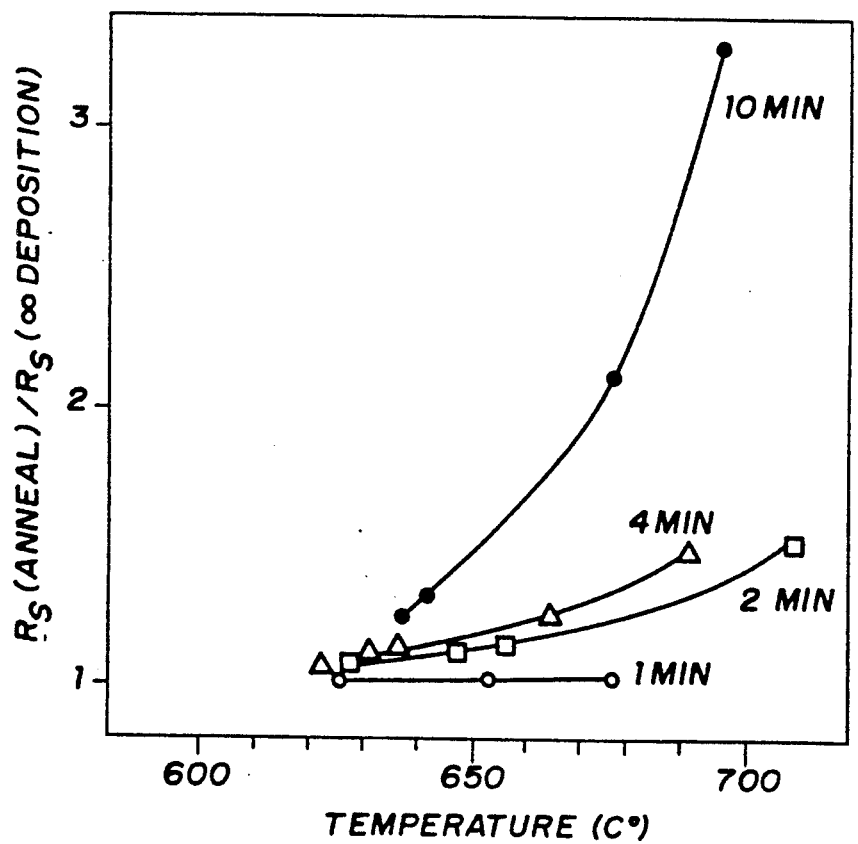
FIG. 2 is a graph showing the relation between the heating time and the resistance of a glass plate during heating.

FIG. 2 displays the results taken of the measurements showing the relationship between heating times and the degradation, for example, the increased resistance value for a glass plate having a fluorine-doped tin oxide layer deposited thereon. Test conditions included heating the coated glass in an atmosphere of air.

A preferred process for the production of the solar cell substrate of the present invention includes heating a glass plate, coating a transparent electrically conductive layer on one side of the glass plate by a chemical vapor deposition method, and then tempering the glass plate by blowing cooling air onto its surfaces.

The most preferred embodiment of the above described process is a process wherein the steps of heating the glass plate having a thin film coating on the incident surface, coating the transparent electrically conductive layer on the opposing surface of the glass plate by a chemical vapor deposition method, and tempering are sequentially performed while transporting the glass plate in a horizontal orientation. This process is highly productive and capable of providing stabilized properties at a low cost.

This process will be described while referring to FIG. 4 which shows a diagrammatic view of the apparatus used to carry out the process.

Figure 4:
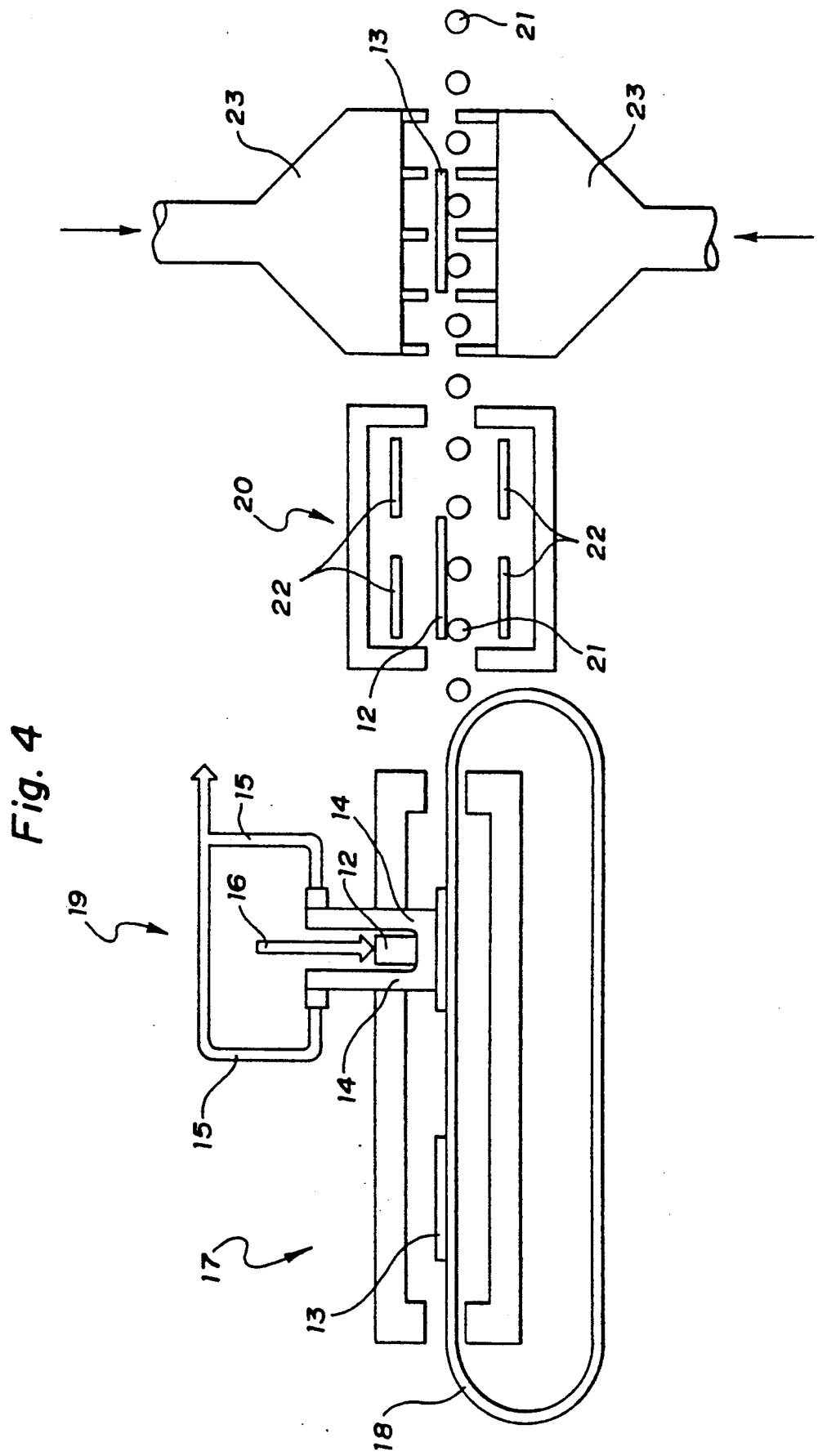
FIG. 4 is a diagrammatical view illustrating an apparatus used to carry out the process of the present invention.

Referring now to FIG. 4, reference numeral 19 generally indicates a chemical vapor deposition device used to carry out the method of the present invention. An injector 12 forms a transparent electrically conductive layer on the upwardly facing surface of a glass plate 13 by chemical vapor deposition. Exhaust vent 14 is connected to exhaust pipe 15 whereby exhaust gases are removed from the system. Feed gas supply pipe 16 introduces the reactive gases for chemical vapor deposition within the furnace 17. Conveyor belt 18 transports the glass plate 13 through the furnace 17 of the chemical vapor deposition device 19.

After injector 12 forms the transparent electrically conductive layer onto glass plate 13, the substrate is transported into a heating furnace 20 by conveyor rollers 21. Heaters 22 heat glass plate 13 as it is being transported therethrough.

After glass plate 13 is heated to the desired temperature, it is transported by conveyor rollers 21 into a quenching unit for tempering. The quenching unit includes nozzles 23 for distributing cooling air to impinge on the opposite surfaces of glass plate 13.

In performing the tempering treatment of a glass plate by means of the above apparatus, a glass plate 13 is placed on the conveyor belt 18 and horizontally transported through the chemical vapor deposition furnace 17 until it is heated to a temperature of from 500° to 600° C. Thereafter, the glass plate 13 is horizontally transported by conveyor 18 to a position below injector 12. While in that position, a layer of a predetermined composition coating is formed by injector 12 on the surface of glass plate 13 by a chemical vapor deposition method.

Glass plate 13 is then transported out of the chemical vapor deposition furnace 17 and is horizontally transported into the heating furnace 20. While glass plate 13 is located within heating furnace 20, heaters 22 heat it to a temperature of from 580° to 650° C., as required for the tempering treatment.

While still being transported horizontally, glass plate 13 is conveyed between nozzles 23 for the tempering treatment. Cooling air is blown through nozzles 23 onto the opposite surfaces of glass plate 13 to rapidly cool it to effect the tempering. Conveyor rollers 21 transport glass plate 13 through the heating furnace 20 and between the nozzles 23. Furthermore, conveyor rollers 21 allow for the removal of the glass plate 13 after the tempering treatment.

Still referring to FIG. 4, injector 12 may be a singular or a multiple unit. The multiple units are favored when a multi-layer lamination is performed. Furthermore, when an alkali barrier coating is to be formed on the surface of glass plate 13 by a chemical vapor deposition, a singular unit or a plurality of units (not shown) of an alkali barrier coating injector may be provided upstream from the illustrated injector 12.

Further processing steps may be effected to produce additional coatings which will be dependent upon the type of solar cell desired. In connection with these potential coatings, there will be additional stations or portions of the apparatus to effect the formation of these coatings on the glass plate.

Referring again to FIG. 4, the conveyor system for glass plate 13 is designed so the steps of heating, coating and tempering may be performed sequentially while conveying the glass plate horizontally. In the illustrated embodiment, conveyor 18 and the conveyor rollers 21 are provided with independent velocity controls (not shown) so that the velocity of each can be adjusted independently. The nature of the processes in the three stations depicted in FIG. 4 dictate the velocity of the conveyance. The tempering step performed as glass plate 13 passes between nozzles 23 is, by its very nature, a faster process than the chemical deposition which takes place in the chemical vapor deposition furnace 17. Further, conveyor rollers 21 located within heating furnace 20 will have a greater velocity than conveyor belt 18 of the chemical vapor deposition furnace 17.

The conveyor belt 18 in the chemical vapor deposition furnace 17 is preferably a heat resistant mesh belt of roll conveyor. It is desirable for the transportation method within heating furnace 20 and between nozzles 23 for the tempering treatment to include a roll conveyor transportation or a glass plate 13 floating transportation by means of hot air injection. The floating transportation may have greater advantage in view of uniformity of temperature and contact with the glass plates.

It is preferred to provide a gas stream controlling means between the chemical vapor deposition furnace 17 and the heating furnace 20 to prevent a change in the gas stream in the chemical vapor deposition furnace 17 as influenced by the heating furnace 20. One embodiment of the present invention includes an air curtain or an air knife acting as the gas stream controlling means.

As a consequence of tempering a glass solar cell substrate provided with a transparent electrically conductive layer, the substrate may exhibit warpage during the heating and cooling of the tempering process. Specifically, the transparent electrically conductive coated side of the substrate may exhibit concavity if not conditioned properly. Therefore, it is desirable to provide control mechanisms to substantially eliminate warpage in the substrate. This is accomplished by, for example, heating the transparent electrically conductive layer side to a higher temperature than the opposite side. Conversely, it is also possible to increase the cooling power on the coated side during the tempering treatment to prevent warpage.

Another way to prevent warpage of the substrate is to apply a thin film coating to the incident surface of the glass plate in addition to the formation of the transparent conductive layer and subsequent tempering of the glass surfaces. The incident surface of the glass plate is defined as the surface which faces the source of energy and through which the solar energy is received. The thin film coating formed on the incident surface of the glass plate counterbalances the surface forces produced by the transparent conductive layer and prevents warpage of the glass plate during the tempering process.

Figure 3:
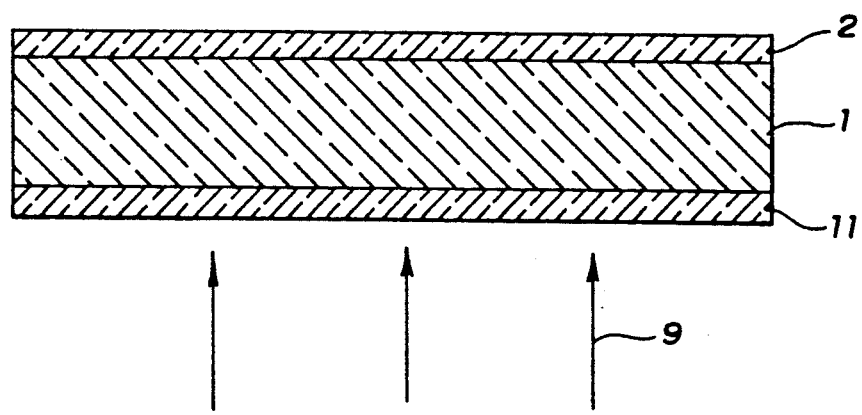
FIG. 3 is a cross-sectional view of the tempered solar cell substrate having a thin film coating on the incident surface of the glass plate.

Additional film layer 11, as shown in FIG. 3, may be deposited by spray pyrolysis, chemical vapor deposition, thermal evaporation, sputtering or any conventional deposition method. Suitable materials for deposition of the thin film coating include, but are not limited to, $ZnO$, $SnO$, $In_2O_3$, $SiN$, and $SiO_2$.

The correct thickness of materials for the thin film coating is essential. It has been found, for example, that coatings of 500–900 nm of $ZnO$ and 0.3–1.0 $\mu$m of $SiO_2$ substantially reduce warpage of the glass plate when heated above 630° C. Generally, the coating on the incident surface of the glass plate should be between 0.1 $\mu$m and 5 $\mu$m in thickness.

Now, the present invention will be described in further detail with reference to Examples. However, is should be understood that the present invention is by no means restricted by these specific Examples.

Example I

A cleaned soda-lime silicate glass plate of 305×306×3 mm was placed on the conveyor and transported into the chemical vapor deposition furnace at a speed of 0.3 m/min. An alkali barrier layer and a fluorine-doped tin oxide layer were successively formed on the glass plate by chemical vapor deposition to obtain a transparent conductive oxide coated glass plate. Then, the coated glass plate was introduced in a continuous motion into the heating furnace on conveyor rolls and heated to a temperature of 620° C. in preparation for the tempering treatment while being transported at a speed of 6 m/min. After heating, the glass plate was quickly removed and moved into a quenching station having an ambient atmosphere, where it was quenched to effect the tempering treatment. The responded to about 35 kcal/m$^2$ hr..C. The characteristic physical properties of the resulting tempered transparent conductive oxide coated solar cell substrate are shown in Table 1. In comparing the properties of this substrate with the physical properties of a transparent conductive oxide coated solar cell substrate obtained by gradual cooling, the tempered transparent conductive oxide coated solar cell substrate obtained by the above process was found to have a surface compression stress which had increased from about 80 kg/cm$^2$ to a level of about 260 kg/cm$^2$. No substantial change was observed in other physical properties such as the surface resistance, the transmittance, the haze, etc., which are also important properties for a solar cell substrate.

Example II

A cleaned soda-lime silicate glass plate of 305×305×3 mm was placed on the conveyor, and introduced into the chemical vapor deposition furnace at a speed of 0.3 m/min. Inside the furnace, an alkali barrier layer and a fluorine doped tin oxide layer were formed successively by chemical vapor deposition to obtain a transparent conductive oxide coated glass plate. The glass plate was introduced into the heating furnace in a continuous motion at a rate of 6 m/min., and heated to a temperature of 620° C. in preparation for subsequent air cooling tempering treatment. Then, the glass plate was quickly removed, and while it was being transported between the nozzles for air cooling at a speed of 25 m/min., cooling air was blown onto the surface of the glass plate at a pressure of 200 mm/Aq. The physical properties of the tempered transparent conductive oxide coated solar cell substrate prepared by the above described process are shown in Table 1. No degradation was observed in other physical properties such as the surface resistance, the transmittance, the haze, etc. The surface compression stress of the tempered transparent conductive oxide coated solar cell substrate obtained by the above process was about 400 kg/cm², which is a factor of 5 higher than the surface compression stress of the transparent conductive oxide coated solar cell substrate not subjected to the tempering treatment.

TABLE 1

| Substrate | Surface compression stress (kgf/cm²) | Warpage (%) | Surface resistance (Ω/□) | Transmittance (%) | Haze (%) |
|---|---|---|---|---|---|
| Not tempered | <80 | <3 | 6.2 | 79.7 | 6.0 |
| Example 1 | ~260 | <3 | 6.3 | 79.1 | 7.0 |
| Example 2 | ~400 | <3 | 6.2 | 81.0 | 5.9 |

According to the present invention, it is possible to manufacture a solar cell substrate having a high resistance to breakage during its use, production, transportation and installation. Further, according to the process of the present invention, it is possible to continuously produce tempered solar cell glass plates at a low cost. Specifically, the steps of coating and tempering the glass plate are continuously and sequentially performed while transporting the glass plate horizontally. By this process, the manufacture is made easy, heat losses are minimized, degradation of physical properties of the transparent electrically conductive layer can be diminished, and the resultant product is a quality solar cell glass plate.

While the best modes for carrying out the invention have herein been described in detail, those familiar with the art to which this invention relates will recognize various alternatives and embodiments for carrying out the invention as defined by the following claims.

What is claimed is:

1. In a solar cell having a semiconductor layer disposed on a solar cell substrate, said solar cell substrate comprising:

a thermally glass plane having an incident and an opposing surface;

a thin film coating deposited on said incident surface of said glass plate producing first surface forces on said incident surface;

a transparent electrically conductive layer formed on said opposing surface of said glass plate, said electrically conductive layer producing second surface forces on said opposing surface counterbalanced by said first surface forces to prevent warping of said glass plate during thermal tempering; and a semiconductor layer formed on said electrically conductive layer.

2. The solar cell substrate as in claim 1 wherein said thin film coating is selected from the group of thin film coatings comprising ZnO, SnO, In₂O₃, SiN, and SiO₂.

3. The solar cell substrate as in claim 1, wherein said tempered glass plate has a surface compression stress of at least 250 kg/cm².

4. The solar cell substrate as in claim 1, wherein said transparent electrically conductive layer is an electrically conductive tin oxide layer.

5. The solar cell substrate as in claim 1, wherein said semiconductor layer comprises: a P-type amorphous silicon layer, an I-type amorphous silicon layer, and an N-type amorphous silicon layer sequentially deposited on said transparent electrically conductive layer.

6. A method for manufacturing a solar cell substrate, comprising the steps of:

forming a transparent electrically conductive layer on one surface of a glass plate, said transparent electrically conductive layer producing first surface forces on said one surface;

depositing a thin film coating on the surface of said glass plate opposite said one surface, said thin film coating producing second surface forces counterbalancing said first surface forces;

heating said glass plate to a predetermined temperature; and rapidly cooling to temper said glass plate.

7. The method as in claim 6, wherein the step of forming a transparent electrically conductive layer is formed by chemical vapor deposition.

8. The method as in claim 6, wherein the steps of forming a transparent electrically conductive layer, depositing a thin film coating, heating said glass plate, and rapidly cooling said glass plate are sequentially and continuously performed while said glass plate is transported horizontally.

9. A method for manufacturing a solar cell on a glass plate having an incident surface and an opposing surface, comprising the steps of:

depositing a thin film coating on said incident surface of said glass plate to produce first surface forces on said incident surface;

forming a transparent electrically conductive layer on said opposing surface of said glass plate to produce second surface forces on said opposing surface counterbalancing said first surface forces;

heating said glass plate to a predetermined temperature below its softening temperature;

rapidly cooling to temper said glass plate; and forming a semiconductor layer on said transparent conductive layer.

10. The method as in claim 9, wherein the step of forming said transparent electrically conductive layer is performed by chemical vapor deposition.

11. The method as in claim 9, wherein the steps of depositing a thin film coating, forming a transparent electrically conductive layer, heating said glass plate, and rapidly cooling are sequentially and continuously performed while said glass plate is transported horizontally.

* * * * *